US009590686B2

United States Patent
Black et al.

(10) Patent No.: US 9,590,686 B2
(45) Date of Patent: Mar. 7, 2017

(54) MAINTAINING A CAPACITOR DIELECTRIC UNDER STRAIN TO REDUCE CAPACITANCE VARIATION DUE TO TIME VARIANT HYSTERISIS EFFECT

(71) Applicant: Google Technology Holdings LLC, Mountain View, CA (US)

(72) Inventors: Gregory R. Black, Vernon Hills, IL (US); Armin Klomsdorf, Chicago, IL (US); Dale G. Schwent, Schaumburg, IL (US); Robert S. Trocke, Caledonia, WI (US)

(73) Assignee: Google Technology Holdings LLC, Mountain View, CA (US)

( * ) Notice: Subject to any disclaimer, the term of this patent is extended or adjusted under 35 U.S.C. 154(b) by 93 days.

(21) Appl. No.: 14/282,073

(22) Filed: May 20, 2014

(65) Prior Publication Data

US 2015/0188595 A1    Jul. 2, 2015

Related U.S. Application Data

(60) Provisional application No. 61/920,793, filed on Dec. 26, 2013.

(51) Int. Cl.
*H04B 1/40*   (2015.01)
*H03H 7/01*   (2006.01)
(Continued)

(52) U.S. Cl.
CPC ............ *H04B 1/40* (2013.01); *H03H 7/0153* (2013.01); *H03H 7/40* (2013.01); *H01G 7/06* (2013.01)

(58) Field of Classification Search
CPC ........ H04B 1/40; H04B 1/3822; H04B 1/406; H04B 1/44; H04B 1/54; H04B 1/48; H04B 1/18
(Continued)

(56) References Cited

U.S. PATENT DOCUMENTS 5,686,813 A * 11/1997 Huen ................. H01M 10/46
                                                    307/150
6,262,910 B1    7/2001 Takata et al.
(Continued)

FOREIGN PATENT DOCUMENTS

EP           0495572 A2      7/1992

OTHER PUBLICATIONS

Courreges, Stanis et al.: "Electronicall Tunable Ferroelectric Devices for Microwave Applications", www.intechopen.com, Chapter 8, Microwave and Millimeter Wave Technologies From Photonic Bandgap Devices to Antenna Applications, Published Mar. 1, 2010, all pages.
(Continued)

*Primary Examiner* — Nhan Le
(74) *Attorney, Agent, or Firm* — Faegre Baker Daniels LLP

(57) ABSTRACT

A method of pre-stressing the variable capacitor device that experiences a temporary time variant hysteresis effect is provided for electronic circuitry, which may include a mobile communication device. The method includes providing a periodic bias voltage to the variable capacitor such that the variable capacitor is maintained at least at a target stress level such that the capacitance of the variable capacitor when subject to a target bias voltage is predictable due to the time variant hysteresis effect being reduced.

27 Claims, 7 Drawing Sheets

(51) Int. Cl.
*H03H 7/40* (2006.01)
*H01G 7/06* (2006.01)

(58) Field of Classification Search
USPC ..... 455/77, 78, 84, 196.1, 197.2, 262, 550.1
See application file for complete search history.

(56) References Cited

U.S. PATENT DOCUMENTS

| | | |
|---|---|---|
| 6,362,018 B1 | 3/2002 | Xu et al. |
| 8,299,867 B2 | 10/2012 | McKinzie, III |
| 8,432,234 B2 | 4/2013 | Manssen et al. |
| 2005/0085204 A1 | 4/2005 | Poilasne et al. |
| 2010/0176895 A1 | 7/2010 | Schmidhammer |
| 2011/0002080 A1 | 1/2011 | Ranta |
| 2011/0304408 A1 | 12/2011 | McKinzie, III |
| 2012/0252391 A1* | 10/2012 | Kanno ............... H01Q 1/243 455/230 |

OTHER PUBLICATIONS

European Patent Office; International Search Report and Written Opinion; International Application No. PCT/US2014/072024; dated Mar. 3, 2015.

\* cited by examiner

MAINTAINING A CAPACITOR DIELECTRIC UNDER STRAIN TO REDUCE CAPACITANCE VARIATION DUE TO TIME VARIANT HYSTERISIS EFFECT

TECHNICAL FIELD

The following disclosure relates to tunable capacitors used in electronic circuitry. More specifically, the following disclosure relates to the maintaining the dielectric of a tunable capacitor under strain during circuit operation in order to reduce capacitance variance due to a time variant hysteresis effect of the tunable capacitor.

BACKGROUND

Capacitors having a voltage-variable dielectric are being employed in tunable RF devices such as antenna tuners and tunable filters. The dielectric constant of a voltage-variable dielectric can be changed by varying a bias voltage across the capacitor, which results in providing a voltage controlled capacitance device.

Presently there are various kinds of voltage controlled or digitally tuned capacitor devices. A digitally tuned capacitor is an integrated circuit (IC) that may be based on one of several technologies. Such technologies may include Micro-Electro-Mechanical Systems (MEMS), Silicon-On-Insulator and Silicon-On-Sapphire (SOI/SOS) devices and Barium Strontium Titanate (BST) variable capacitive devices. MEMS, SOI/SOS and BST devices are presently available from a number of suppliers and vary in capacitance range, quality factor and resolution for use in different RF tuning applications.

MEMS devices tend to have the highest quality factor and are highly linear. MEMS devices are suitable for antenna aperture tuning, dynamic impedance matching, power amplifier load matching and adjustable filters.

SOI/SOS tuning devices are constructed of solid state field effect transistor (FET) switches built on insulated CMOS wafers and use metal-insulator-metal (MIM) capacitors arranged in binary-weighted values to achieve different capacitance values. SOI/SOS switches are highly linear and are well suited to low power applications where high voltages are not present.

BST variable capacitor devices are based on Barium Strontium Titanate and vary their capacitance when a bias voltage is applied to the device. The tuning capacity of BST devices is limited, in part, by the accuracy of a digital-to-analog converter (DAC) circuit that generates the bias voltage applied to the BST variable capacitor device. BST variable capacitor devices are employed in tunable RF devices, such as antenna tuners and tunable filters, because of the high sensitivity that their dielectric material has to an applied voltage for changing the dielectric constant of the variable capacitor device.

BRIEF DESCRIPTION OF THE DRAWINGS

For a more complete understanding, reference is now made to the following description taken in conjunction with the accompanying Drawings in which.

DETAILED DESCRIPTION

Figure 1:
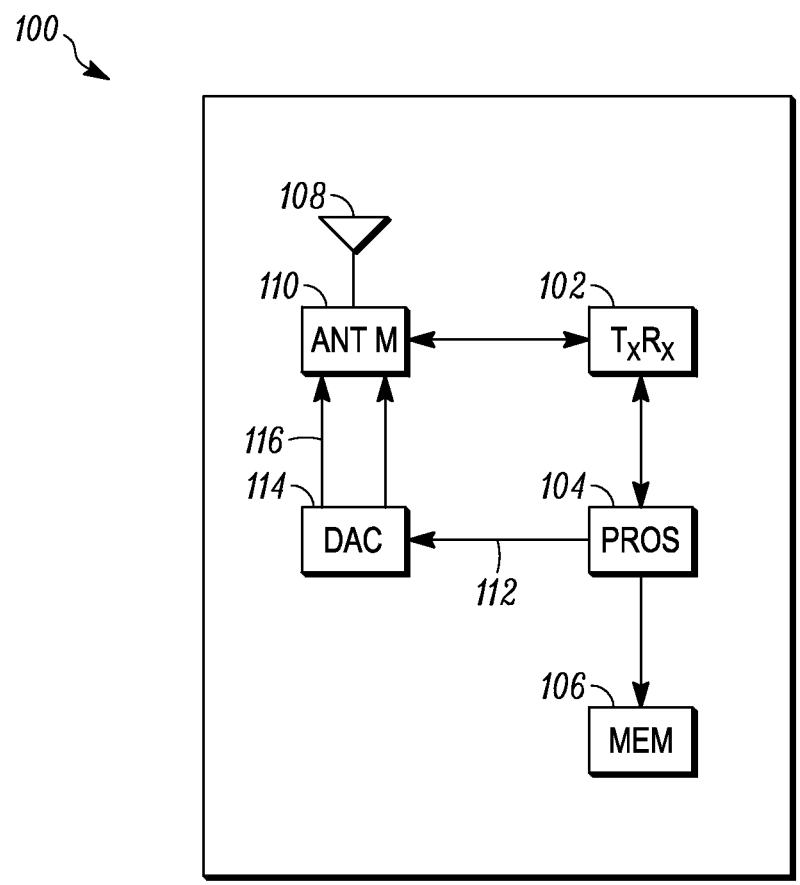
FIG. 1 illustrates a block diagram of an example of a mobile communication device.

The illustrated embodiments provide a method and communication device that implement a voltage-variable dielectric in tunable RF devices such as antenna tuners and tunable filters. Exemplary methods and communication devices are configured to maintain the voltage-variable dielectric material within a voltage-variable capacitor, which experiences temporary hysteresis effects, in or around a target stressed state in accordance with a mathematical model such that the overall resulting variation in capacitance due to the time variant hysteresis effect is minimized. The mathematical model, which is used to maintain a predetermined or near predetermined level of stress in the voltage-variable dielectric material, may be operated or performed by application software running on a processor within the mobile communication device. The application software may configure the processor to keep a running tally of the bias voltage applied, the amount of time that bias voltages are applied to each voltage-variable capacitor, and the operating temperature. Such information may be stored by and used in the mathematical model to maintain a near predetermined amount of stress on each voltage-variable capacitor device by applying a bias voltage to the voltage-variable capacitor device(s) periodically or during periods of capacitor nonuse.

In the following detailed description embodiments are provided and described in sufficient detail to enable those skilled in the art to practice this disclosure. It is to be understood that other embodiments may be utilized and that logical, architectural, programmatic, electrical and other changes may be made without departing from the spirit or scope of the present disclosure. The following detailed disclosure is, therefore not to be taken in a limited sense, and its scope is defined by the appended claims and equivalents thereof.

Within the descriptions of the various figures, similar elements or method steps are provided similar names and reference numerals as to those of previous figures. The specific numerals assigned to the elements are provided solely to aid in the description and are not meant to imply any limitations (structural, functional, order in time, or otherwise) on the described element.

It is understood that the use of specific component, device and/or parameter names, such as those used to indicate executing utility, logic, or firmware described herein, are for example only and not meant to imply any limitations on the described embodiments. Embodiments may be described with different nomenclature, terminology or acronyms utilized to describe the components, devices and parameters herein, without limitation. References to any specific protocol or proprietary name in describing one or more elements, features or concepts of the embodiments are provided solely as examples of one implementation, and such references to not limit the extension of the claimed embodiments to the embodiments in which a different element, feature or concept name is utilized. Thus, each term utilized herein is to be given its broadest interpretation given the context in which that term is utilized.

As further described below, implementation of the functional features of the disclosure described are provided within processing devices/structures and can involve the use of a combination of hardware, firmware, as well as several software-level constructs (e.g., program code) that are executed by a processor device to provide a specific utility for the device. The presented figures illustrate both hardware components and software/logic components within an exemplar communication device architecture.

Capacitors with voltage-variable dielectric properties are employed in tunable RF devices such as antenna impedance matching circuits, antenna tuners and tunable filters. The dielectric constant of a voltage-varying dielectric can be changed by varying a bias voltage across the variable capacitor device. When the bias voltage across the variable capacitor device is changed, the resulting capacitance of the device is also changed. Barium Strontium Titanate (BST) dielectrics are often used as the voltage-variable dielectric within a voltage-variable capacitor device because BST has a high sensitivity and response to a changing bias voltage by changing its dielectric constant.

One drawback of using voltage-variable capacitors, such as voltage-variable BST capacitors, is that after a relatively high bias voltage is applied to the voltage-variable capacitor, the dielectric constant of the capacitor does not immediately return to its original or 0 V bias state. This effect is thought to be due to a strain or stress created in the BST dielectric material lattice during the application of a relatively high bias voltage. It is further thought that the strain, or stress placed on the dielectric material requires a relatively long time (as compared to the amount of time that the bias voltage is applied) to relax and allow the dielectric constant to return to its initial, 0 V or relaxed state prior to the application of the bias voltage. This phenomenon is denoted in literature as a Return to Zero effect or a time variant dielectric hysteresis effect, collectively the RTZ effect.

This RTZ effect results in a RTZ capacitance shift of about 7 to 18% from the BST dielectric's steady state capacitance where a 0 V bias is applied. The RTZ effect occurs very quickly when a bias voltage is briefly applied to the voltage-variable capacitor. In fact, the RTZ effect can occur when a bias voltage is applied for as little as 100 ms and then can last for a relatively long time, for example, for about an hour or more afterwards.

When voltage-variable BST capacitors are used in antenna matching circuits, this phenomenon, if not corrected, leads to uncertainty in matching the impedance of an antenna with a transceiver circuit, thus requiring a more broadband (larger) antenna configuration.

FIG. 1 depicts a basic block diagram of an mobile communication device 100, such as a mobile phone, smartphone, laptop, netbook, tablet computer or similar device. The mobile communication device 100 can be any type of wireless communication device having a transceiver 102 for two-way communication over a wireless network. The mobile communication device 100 comprises an application processor (processor) 104 and memory 106 configured to store, among other things, application software and data utilized by the processor 104 to perform various mobile communication device related functions. The transceiver 102 is an RF transceiver that enables the mobile communication device 100 to send and receive communication signals over a wireless communication network.

Mobile communication devices, such as mobile communication device 100, may be adapted or configured to communicate over one or more wireless communication networks. Such wireless communication networks may include, but are not limited to, cellular telephone systems or other long-range wireless communication systems such as the Global System for Mobile Communications (GSM) telephone bands, Enhanced Data rates for GSM Evolution (EDGE); General Packet Radio System (GPRS); CDMA; such as IS-95; CDMA2000; WCDMA or Universal Mobile Telecommunications System (UMTS); Fourth Generation Long Term Evolution (LTE); other wide area network communication systems; PrivateMobile Radio (PMR); Worldwide interoperability for Microwave Access (WIMAX); WLAN; other 3G or 4G networks; or the like. UEs may also use short-range wireless communication protocols to support communications with nearby devices, including Wi-Fi (IEEE 802.11) and Bluetooth devices.

Signals communicated by the transceiver 102 are transmitted or received via one or more antennas, such as antenna 108. The mobile communication device 100 further comprises an antenna matching circuit 110, which is used to adjust the impedance seen by both the antenna 108 and the transceiver 102. For example, the antenna matching circuit 110 is configured to match the impedance between the transceiver 102 and the antenna 108 based on the signal frequency being transmitted or received. In radio frequency systems, a common value for source and load impedances is 50 ohms though other impedance values can also be used. Thus both the transceiver 102 and the antenna 108 are often matched to 50 ohms using the antenna matching circuit 110.

The antenna matching circuit 110 serves to maximize the power delivered from the transceiver to the antenna and vis-à-vis. Maxim power delivered generally occurs when both the antenna and the transceiver are impedance matched by the antenna matching circuit 110 to about 50 ohms. When the antenna matching circuit is perfectly matched it is said to have a gain of 1. If the antenna matching circuit is not perfectly matched the gain is considered to be less than 1. The closer the gain is to 1 the better the impedance match.

The antenna matching circuit 110 may include a plurality of tunable capacitors and fixed inductors. The tunable capacitors used in a matching circuit 110 of an example mobile communication device 100 may be voltage-variable BST capacitor devices. The application processor 104 provides a digital tuning signal 112 to a digital-to-analog converter (DAC) circuit 114, which in turn provides one or more tuning voltages 116 to the antenna matching circuit 110 in order to tune the impedance of the antenna matching circuit so that the transceiver 102 and/or antenna 108 see an impedance of, for example, about 50 ohms.

As discussed above, when the voltage-variable BST capacitor device, or another similar device or derivation thereof (hereinafter a "variable capacitor") is used in, for example, an antenna matching circuit 110, the variable capacitor's RTZ effect can cause a capacitance shift of about 15% to 18% from the variable capacitor's steady state capacitance when a 0 V bias is applied. The RTZ effect or time variant hysteresis effect causes a reduced tuning range and an uncertainty as to what the capacitance value of the variable capacitor is due to the variable capacitor's recent history of having a bias voltage applied.

Through experimentation it was found that the uncertainty of the capacitance of the variable capacitor can be minimized when the variable capacitor is maintained in a stressed or strained state during operation. Thus, various embodiments provide a method for increasing the certainty of the variable capacitance of a variable capacitor by keeping the variable capacitor's dielectric material in a strained state such that a dielectric constant (i.e., the capacitance) of the variable capacitor can be determined and set to within about a +/−5% accuracy or better. The result is a more accurate tuning of an antenna tuning circuit that results in less signal or power loss of the received or transmitted signal. This compensation of the RTZ effect allows the antenna and the antenna tuning circuit to take advantage of using the variable capacitor.

The variable capacitor may have a large tolerance or uncertainty (up to about 18%) in its capacitance value after application of a large bias voltage. The capacitance tolerance or uncertainty is a function of the past history of bias voltages applied to the variable capacitor and how long each such bias voltage was applied. The past history of the variable capacitor includes how long the device remained at a 0 V bias voltage. When a variable capacitor is left at a zero bias voltage for a long period of time (for example 24 hours), the variable capacitor will return to an original capacitance ($C_O$). Alternatively, when a variable capacitor is biased at a certain voltage for a short period of time and then returned to zero bias, the variable capacitor will have an initial capacitance ($C_I$), which will be different from, and usually less than, the original capacitance ($C_O$). The difference between the two capacitance values, $|C_O-C_I|$, is equal to the variable capacitor's tolerance or uncertainty for the bias voltage applied for the amount of time that it was applied.

It may take from less than an hour to about 24 hours, depending on the temperature, the bias voltage, and the amount of time the bias voltage was applied, for a variable capacitor to return to its original capacitance ($C_O$). The RTZ effect or time variable hysteresis diminishes quickly in a warm environment than in a cold environment. For example, in a very warm environment of greater than about 100° F. the RTZ effect may last for only a few minutes. Conversely, in a cold environment of less than about 30° F. the RTZ effect may last for up to about 24 hours. In other words, the stress on the dielectric material within the variable capacitor releases faster in a warm environment than in a cold environment.

When used in actual circuitry, for example, in an antenna matching circuit 110 within a mobile communication device 100, there may be a minimal voltage, perhaps about 2 V or less, continuously applied as a bias voltage to the variable capacitors while the circuitry is powered on. Thus, each variable capacitor may never have a 0 V bias voltage applied to it while its mobile communication device is operating. Additionally, the application of bias voltages for various periods of time in an operating circuit will cumulatively add to the stress of the dielectric material within a variable capacitor.

It's been found that the capacitance error due to the time variant hysteresis effect or RTZ effect is minimized when operating a variable capacitor at bias voltages near its maximum allowable bias voltage. Alternatively, it has been found that the uncertainty of a variable capacitor's capacitance increases when the variable capacitor is biased at a low-voltage after being biased at various higher, but non-maximum, bias voltages.

Figure 2:
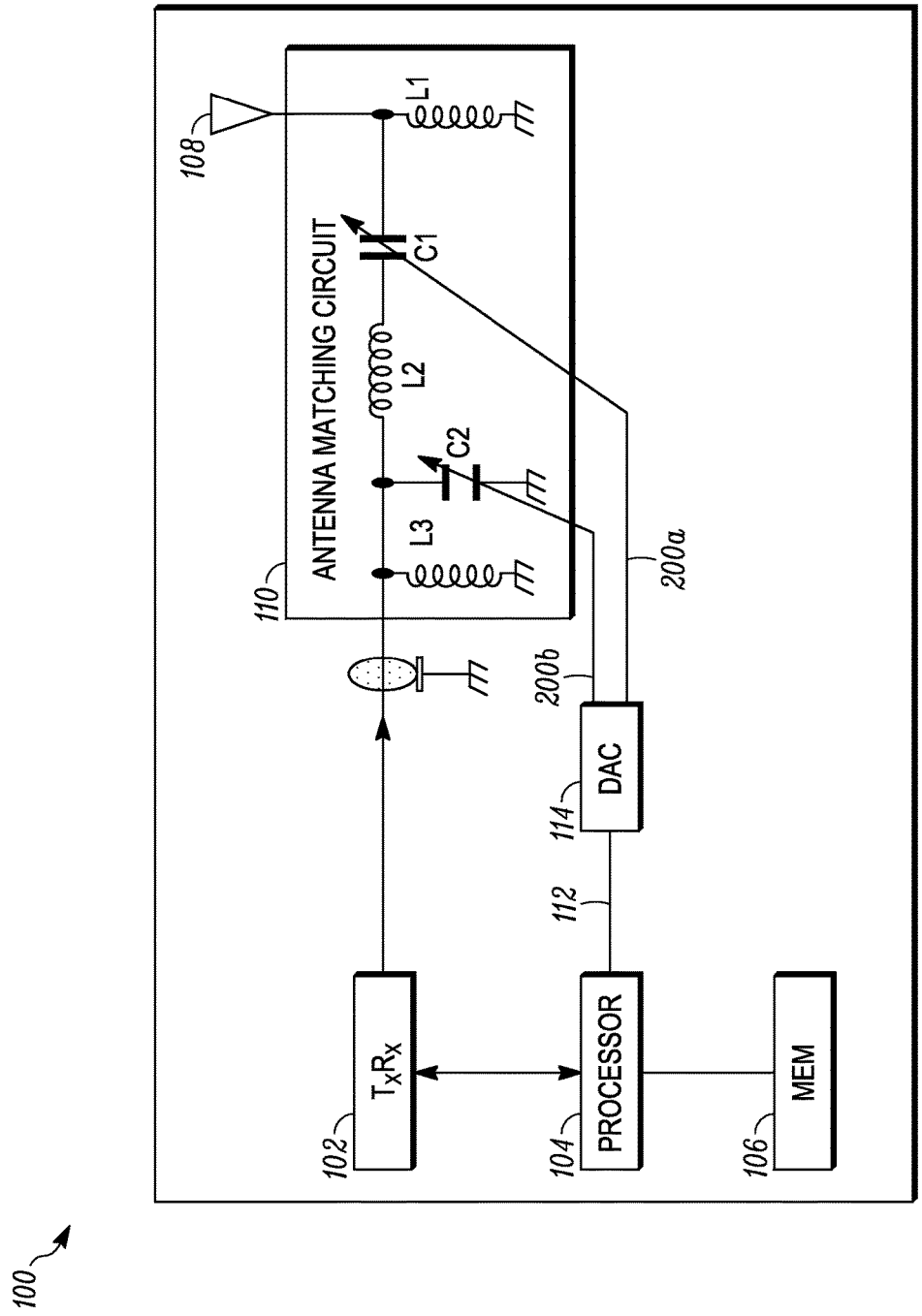
FIG. 2 illustrates a basic circuit diagram of an embodiment of an antenna matching circuit.

In essence, the RTZ effect creates a time variant hysteresis on the capacitance vs. voltage curve of a BST variable capacitor device. The time variant hysteresis effect reduces the maximum capacitance attainable by the variable capacitor and shifts the capacitance vs. voltage curve within the higher capacitance region (i.e., at a low bias voltage) region downward. The magnitude or the amount of capacitance error produced by the time variant hysteresis is related to the amount of time that the variable capacitor is exposed to higher bias voltages (e.g., 10-20 V), which produce lower capacitance values on the variable capacitor. Thus, whether the variable capacitor is operating at low bias voltages or at high bias voltages, the amount of time each bias voltage is applied to the variable capacitor affects the overall magnitude or amount of error created by the time variant hysteresis effect. When the dielectric material is maintained at a high level of stress (i.e. near a maximum bias voltage), the variance in the capacitance vs. voltage curve is minimized for all bias voltages FIG. 2 is a block diagram of a mobile communication device 100, but with the antenna matching circuit 110 provided as a basic circuit diagram. The application processor 104 is connected to the transceiver 102 to control the transmission or reception of the transceiver. In this embodiment, the antenna matching circuit 110 comprises three inductors L1, L2, L3 and two variable capacitors C1 and C2. The inductors L1, L2, L3 and capacitors C1, C2 are configured to enable maximum power delivery to the antenna 108 from the transceiver 102 by matching the output impedance of the transceiver with the input impedance of the antenna for the frequency being transmitted. Alternatively, when receiving a signal at the antenna 108, the inductors L1, L2, L3 and capacitors C1, C2 are configured to maximize reception of a signal by providing a 50 ohm impedance as seen from the antenna to the transceiver 102. The matching or tuning of the antenna 108 at matching circuit 110 is accomplished by the application processor 104 utilizing a mathematical model associated with the variable capacitors C1 and C2. The processor provides a digital tuning signal 112 to the DAC 114, which converts the digital tuning signal 112 into one or more voltages 200a, 200b. The voltages 200a, 200b are, as described below, applied to the variable capacitors C1 and C2 and are used to adjust the capacitance of the variable capacitors C1 and C2. The variable capacitors C1 and C2 ultimately change the impedance of the antenna matching circuit 110 so that the antenna/transceiver combination can transmit and receive various frequencies such that the gain of the matching circuit is maximized to be as close to a gain of 1 as possible. In order for the gain of the antenna matching circuit to be maximized the capacitors C1 and C2 must be adjusted to within a few percent of the necessary capacitance values that will make the antenna matching circuit closely match the impedance seen by the transceiver and or the antenna.

In some embodiments the DAC 114 can provide a bias voltage 200a, 200b to the variable capacitors C1 and C2 respectively in a range from about 0 V to about 20 V. In other embodiments the minimum voltage that can be applied or provided by the DAC 114 is around 2 volts.

It is understood that the adjustable or programmable antenna matching circuit 110 is only one of many variations of potential adjustable or programmable antenna matching circuits. For example, other antenna matching circuits may have additional parallel feeds or inputs from/to the transceiver with parallel impedance matching circuits having additional variable capacitors enabling the transceiver to simultaneously utilize the antenna at different frequency bands. Regardless, programmable or adjustable antenna matching circuits may comprise variable capacitors that after being stressed with a bias voltage will exhibit a time variable hysteresis effect or RTZ effect. As will be explained in more detail below, when the dielectric material of the variable capacitor is maintained at or above a target stress condition, the capacitance of the variable capacitor when at a zero bias state is maintained at a lower value than when the variable capacitor's dielectric material is in an unstressed state. Additionally, it has been found that keeping a variable capacitor in a controlled stress state reduces the capacitance variation due to the return to zero effect for any applied bias voltage.

Figure 3:
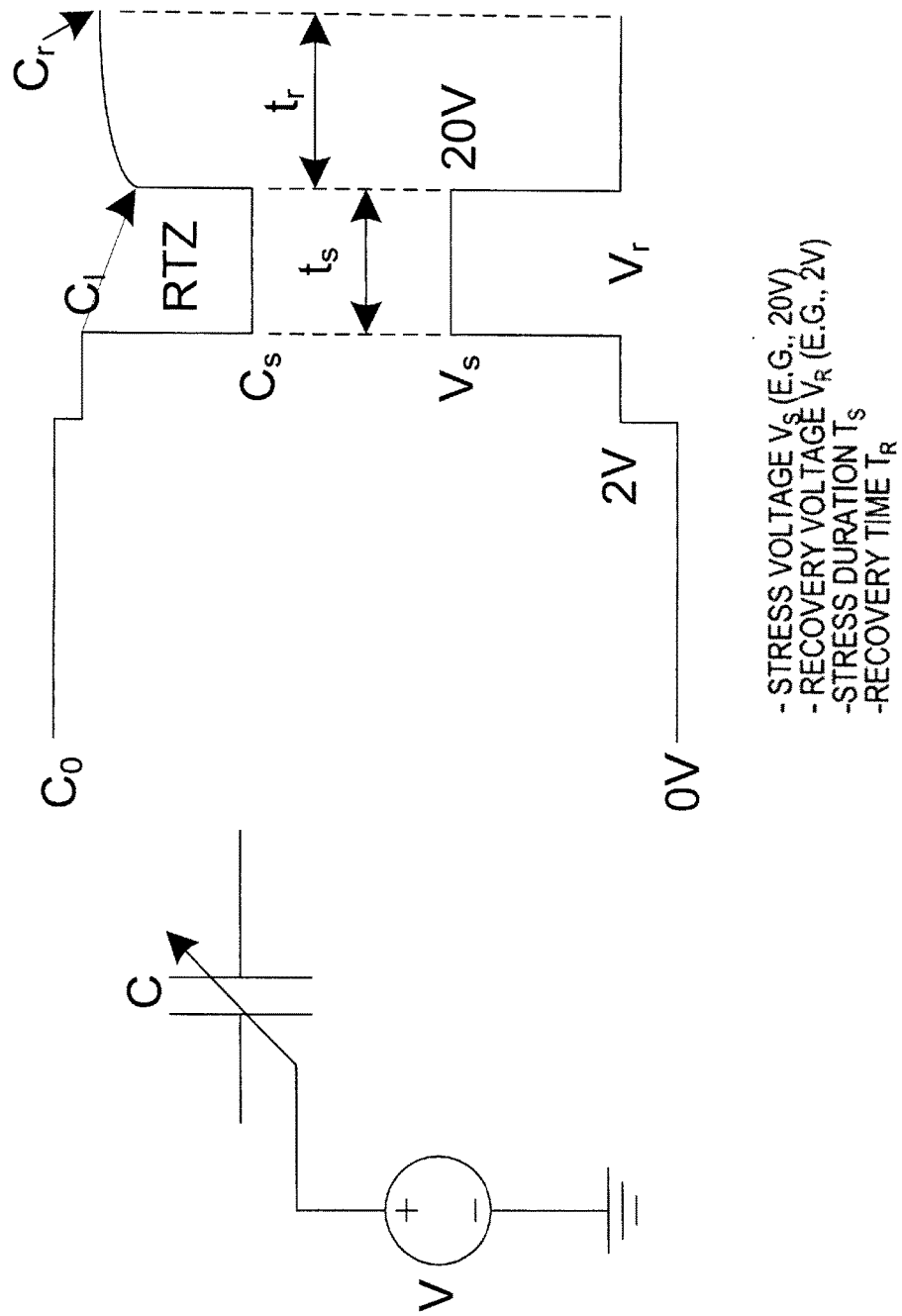
FIG. 3 illustrates a BST variable capacitor connected to a bias voltage source next to a graph showing an example of how the time varying hysteresis of the capacitance (Return To Zero (RTZ)) effect of a BST variable capacitor is affected by the application of a bias voltage.

FIG. 3 depicts a BST variable capacitor C connected to a bias voltage source V next to a graph showing an example of how the time varying hysteresis or RTZ effect on the capacitance of the BST variable capacitor C is affected by the bias voltage V. When the bias voltage V is 0 V, the capacitance of the variable capacitor C is at an original capacitance $C_O$. This, of course, assumes that the capacitor C has not been biased for a long period of time. When the mobile communication device is turned on, a bias voltage V of 2 V is applied to the BST variable capacitor C and the capacitance drops to an initial capacitance $C_I$, which can be considered the maximum operating capacitance of this example. As long as the bias voltage V remains at 2 V, the initial capacitance $C_I$ remains constant.

At some point in time, the transceiver needs to send or receive a signal and a bias voltage V greater than 2 V is applied to the variable capacitor C so as to tune the impedance of the antenna matching circuit for a particular frequency band. When the bias voltage is brought to a higher voltage, the voltage is considered a stress voltage $V_S$. In this example, the stress voltage Vs is 20 V. The stress voltage $V_S$ lowers the capacitance of the variable capacitor C to a stressed capacitance $C_S$. The antenna matching circuit is set to its target impedance and the transceiver receives a signal from the antenna over a period of time. Thus, the variable capacitor C is held at the stress voltage $V_S$ for a stress duration of time $t_s$. As the bias voltage is held at the stress voltage $V_S$ for the stress duration of time $t_s$, the time variable hysteresis effect (RTZ effect) occurs. The RTZ effect, as discussed earlier, is reduced at the higher stressing voltage settings wherein the capacitance of the dielectric material within the variable capacitor C is minimized. Instead, stress caused by the higher bias voltage stresses the dielectric material thereby making it less able to return immediately to the initial capacitance $C_I$ level when the bias voltage V on the variable capacitor C is dropped back to 2 V.

When the bias voltage V applied to the variable capacitor C is dropped back to 2 V, the capacitor C is allowed to recover during the recovery time $t_R$. During the recovery time $t_R$ the capacitance of the capacitor C does not fully recover back to the initial capacitance $C_I$, but instead recovers to a recovery capacitance $C_R$, which is lower than the initial capacitance $C_I$. In this example, the tolerance of the variable capacitor C is the capacitance difference between $C_I$ and $C_R$.

During operation within a mobile communication device, the variable capacitor will be biased at multiple voltages for multiple periods of time, making the tolerance of the capacitor very difficult to predict or calculate due to the variability of the time variant hysteresis effect, which increases quickly each time a higher bias voltage is applied and decreases slowly when a lower bias voltage is applied. Additionally, the operating temperature of the device affects the rate at which the time variant hysteresis effect decreases during any recovery time.

Figure 4:
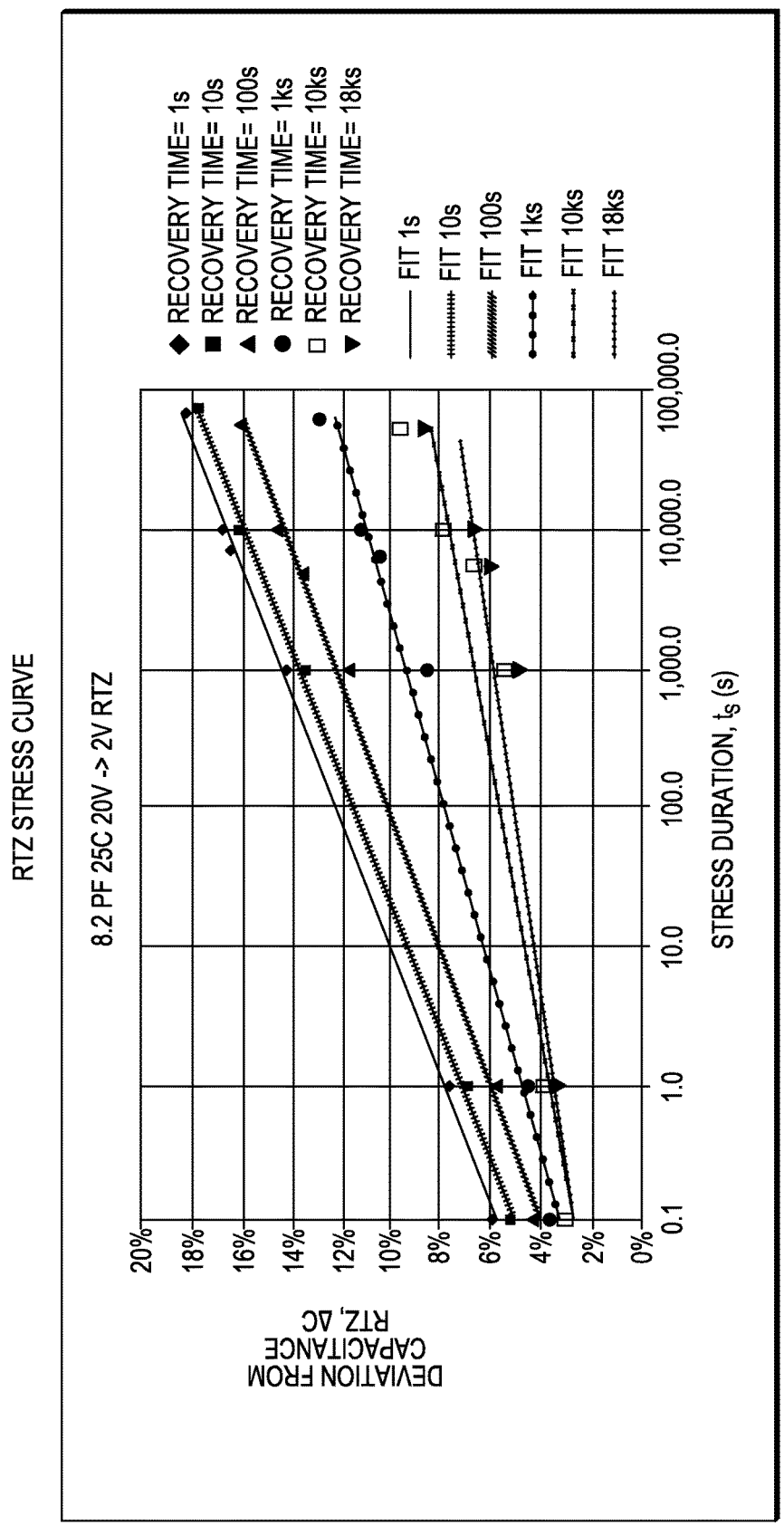
FIG. 4 illustrates a graphical depiction of the measured deviation from an expected capacitance after a particular recovery time due to an RTZ stress applied to a BST variable capacitor for a stress duration time ($t_s$)

FIG. 4 is a graph showing the deviation of a measured capacitance from an expected capacitance after a defined recovery duration time due to an RTZ stress (i.e., a bias voltage) applied to a BST variable capacitor for a stress duration time ($t_s$). For example, a BST variable capacitor having an unstressed capacitance of 8.2 pF is stressed with a bias voltage of 20 V for a stress duration $t_s$ and the allowed to recover at a bias voltage of 2 V at room temperature for a recovery time $t_R$ equal to 1 second, 10 seconds, 100 seconds, 1000 seconds, 10,000 seconds and 18,000 seconds. A best fit graph line is shown for each recovery time period $t_R$. For example, the graph shows that after a 20 V stress duration of 1 second is applied to the variable capacitor, which is then allowed to recover for one second, the measured capacitance of the variable capacitor deviated from the unstressed original capacitance of 8.2 pF by about 8%. When the same variable capacitor was stressed and 20 V for duration of 1 second and then allowed to recover for 100 seconds the deviation from the original capacitance was about 6%; When stressed at 20 V for 1 second and then provided a recovery time of 1000 seconds, the deviation was about 5%. Basically, the graph supports the fact that it takes a short time for a variable capacitor to be stressed by a bias voltage and a relatively long time for the variable capacitor to recover back to the original capacitance.

Still looking at the graph in FIG. 4, when the variable capacitor is stressed at a bias voltage of 20 V for a stress duration of 10K seconds and then allowed to recover for 1 second at a recovery voltage of 2 V, the variable capacitor's deviation from its original capacitance is about 17%. When stressed at 20 V for a duration of 10K seconds and then allowed to recover for 100 seconds at 2 V, the capacitance deviation dropped to 15%; Furthermore when placed under the same stress condition and then given a recovery time of 1K seconds, the capacitance deviation remained significantly high at about 11%. Thus, as discussed above, this chart shows that it can take a long time for a variable capacitor to fully recover from a large bias voltage that has been applied for a significant amount of time. Moreover, this chart shows that the variable BST capacitor's dielectric material responds quickly to the onset of stress in the form of a large (more than 10 V) bias voltage, but recovers much more slowly when the bias voltage is lowered to a relatively low voltage of about 2 V.

Figure 5:
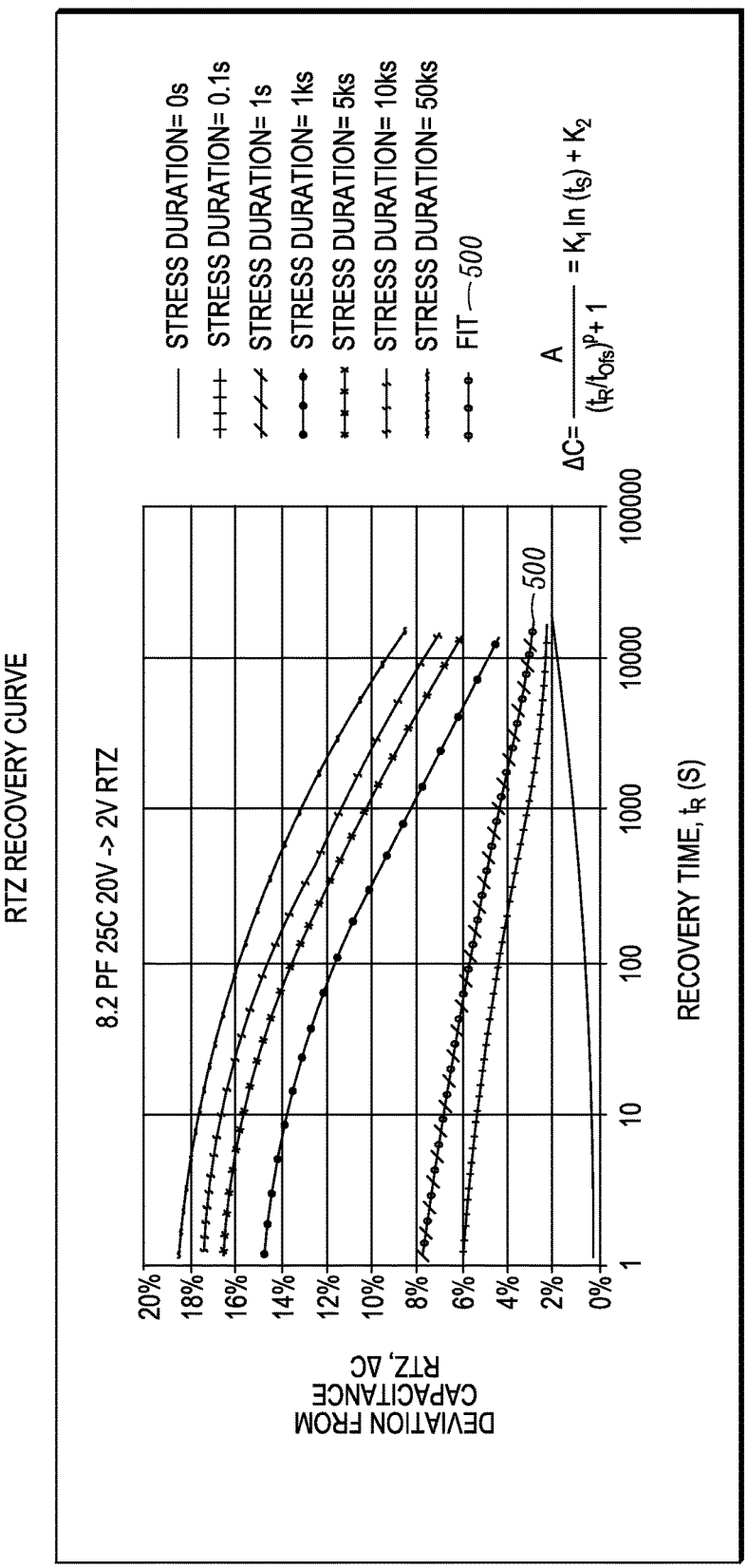
FIG. 5 illustrates a measured percent deviation from an expected capacitance of a BST variable capacitor after being stressed by bias voltage for a determined amount of time and allowed to recover from the RTZ stress for a recovery time ($t_s$)

FIG. 5 depicts a plurality of recovery curves showing the deviation of a measured capacitance from an expected capacitance with respect to recovery time $t_s$ after the variable capacitor was stressed at 20 V for preselected stress duration $t_s$ and then allowed to recover while being biased at 2 V. The variable capacitor has an original unstressed capacitance of 8.2 pF. The variable capacitor was then stressed at 20 V for stress duration periods $t_s$ of 0 seconds, 0.1 seconds, 1 second, 1000 seconds, 5000 seconds, 10,000 seconds, and 50,000 seconds. After being stressed, the variable capacitor was allowed to recover over time. At various recovery times $t_r$ the capacitance of the variable capacitor was measured and the deviation of capacitance from its original capacitance of 8.2 pF was charted in the graph. This graph shows that it is difficult to predict what the capacitance deviation of a variable capacitor will be when biased at a low voltage (e.g. 2 V) after being stressed at a high bias voltage (e.g. 20 V) for different amounts of time. This graph also shows that there is a need to reduce the variability of the capacitance vs. voltage curve of the variable capacitor, such as a BST variable capacitor, so that the capacitance of the variable capacitor is more predictable when biased at any voltage. When the capacitance of a variable capacitor is more predictable, the variable capacitor can be used in circuitry to provide relatively consistent performance and results. In other words, what is needed is a way to use a variable BST capacitor in an antenna matching circuit so that the accuracy of the antenna matching circuit can provide consistent antenna impedance matching regardless of the voltage bias stressing history that has been applied to the variable capacitor.

In various embodiments, a system and method is provided that limits the overall capacitance deviation of a variable BST capacitor to less than about +/−5% from an expected capacitance regardless of the bias voltage applied, the operating temperature, or the historic bias voltages recently applied to the variable capacitor.

As discussed above the stressing or biasing of a variable dielectric is found to be cumulative over time. Thus, stressing the dielectric, for example, for 1 second periodically during the recovery time will maintain the variable capacitor's dielectric in a stressed condition. It was found by experimentation that when a variable BST capacitor is continuously stressed at or near a predetermined level of stress, the variable BST capacitor will have a same predictable capacitance at each applied bias voltage.

Still referring to FIG. 5, a best fit curve 500 was mathematically calculated to be the best fit for all the measured data associated with the plurality of recovery curves in the graph. The best fit curve 500 helps predict the time variant hysteresis (RTZ) effect of the variable capacitor device tested so that any amount of bias voltage (within an acceptable range of bias voltages) can be applied to the dielectric and a predictable capacitance within about +/−3 to +/−8% accuracy results. The best fit curve 500 provides an equation that mathematically models the variable capacitor's BST dielectric material without physically determining what is occurring in the capacitor device. It is understood that there are various acceptable mathematical techniques for creating a best fit curve for a plurality of graphical curves on a graph. The best fit curve 500 or another equation established to describe or define the graphical data curves can be used to model the capacitance vs. voltage curve for a variable BST capacitor wherein the capacitor is placed in a pre-stressed condition.

In some embodiments of the invention, a method is provided that reduces the variance of the capacitance vs. voltage curve of a variable capacitor. In some embodiments the method, and/or mathematical model operate to eliminate areas on the RTZ recovery curves where the capacitance of the device deviates the most from the original or relaxed state of the variable capacitor. In other words, the method or mathematical model eliminates the areas of the capacitance vs. voltage curve that deviate the fastest over time. Additionally, embodiments are configured to operate in the areas of the capacitance vs. voltage that tends not to vary much (e.g., not more than a few percent) over a fixed amount of time. The result is that small variations in the operating conditions of the variable capacitor will not result in large variations in the resulting capacitance. Thus, embodiments provide a variable capacitor that provides a predictable capacitance that does not vary more than a few percent from a predicted value for any bias voltage regardless of the operating history of the device over the past 24 hours.

Embodiments provide a variable capacitor that operates such that normal bias voltage variations applied to the variable capacitor result in small deviations (about +/−2 to +/−5%) from the expected capacitance of the variable capacitor for the particular bias voltage when the variable capacitor's dielectric material is maintained in a pre-stressed condition. Embodiments eliminate or avoid the original, relaxed or unstressed state of the variable capacitor and maintain, at least, a baseline pre-stress of the dielectric material during operation. In some embodiments, the baseline pre-stress is accomplished by applying and tracking the application of a periodic bias voltage along with all the ordinary bias voltages applied to the variable capacitor during normal device transmission and reception operation.

It should be understood that the object is not to keep the variable capacitor's dielectric material at its highest stress or at too large a stress level because doing so will limit the advantages of pre-stressing the dielectric material by not allowing the variable capacitor to obtain higher potential capacitance values when stressed at the lowest bias voltages.

Some embodiments have two modes of operation being an idle mode and a connected mode. When a mobile device is on and in idle mode, the transceiver/antenna is either not transmitting or receiving or is intermittently transmitting and receiving information in a standard predetermined periodic basis based on the paging cycle of the wireless communication network. In idle mode, mobile device applications running on the application processor are generally not demanding very much of the antenna and transceiver. In idle mode, the mobile device may be waiting for a call or monitoring various channels at a low predetermined duty cycle. The mobile communication device may be making power measurements of nearby cells, receiving pilot channel signals, sending paging signals or performing other standby or idle mode basic operations. Thus, there may be some stress applied to the variable capacitors within the mobile device's antenna matching circuitry, though minimal, in the form of bias voltages. The bias voltages applied to the variable capacitors and the length of time that bias voltages are applied can be easily tracked and used by a mathematical modeling application running on the application processor. The mathematical modeling application keeps a running estimate of the approximate amount of stress that the dielectric material of each variable capacitor. If it is determined that the dielectric stress on a variable BST capacitor is not at or above the predetermined base line or target level, the mathematical modeling application may apply a fixed amount of periodic stress in the form of a periodic bias voltage to the variable BST capacitor in order to keep it at or above a certain predetermined baseline or target level operating range.

Additionally when a mobile communication device is first turned on, the device initially enters a type of idle mode. In the initial type of idle mode, an initial stress, in the form of a bias voltage, may be applied to the variable capacitors right after the mobile communication device is turned on, but before the transceiver is activated to begin any initial communication with the wireless network. The initial bias voltage applied to the variable capacitors brings the variable capacitors up to the baseline or target level amount of stress so that when the transceiver turns on and the microprocessor tunes the antenna matching circuit to match the impedance between the transceiver and the antenna, the variable capacitors will be set by the control voltage to within about +/−2 to +/−5% of the capacitance that is necessary for proper tuning of the antenna matching circuit.

The other mode, being connected mode, is where the mobile communication is actively communicating over the wireless network and tuning and retuning the antenna matching circuits such that they properly match the impedance between the antenna and the transceiver for each channel and frequency that is being used. The mobile communication device may be in the process of sending/receiving a call or text messages and thus actively connected to the wireless communication network. Here the mobile communication device is on, but the operating conditions are much more variable then when the mobile communication device is in idle mode. The mobile communication device may be operating in multiple frequency bands that require different voltages on the variable capacitors within the antenna matching circuits. The communication may be continuously on one band because the user is stationary. Alternatively, the communication may be jumping from one frequency band to another frequency band because the user is moving and the mobile communication device is being handed off from cell to cell. The mobile communication device may also be handling a call while simultaneously allowing the user to interact with the Internet via the wireless network thus requiring tuning and retuning of the variable capacitors within the matching antenna circuits.

In connected mode, the accumulated stress on the variable capacitors due to the bias voltage levels being applied and the amount of time that the bias voltage levels are being applied are monitored and tracked by the mathematical capacitance stress model application. The bias voltages being applied and the amount of time they are applied is tracked by the mathematical capacitance stress model application so that the mathematical capacitance stress model application can determine whether additional stress or no additional stress, in the form of a bias voltage, is needed to be applied to any one of the variable BST capacitors.

If additional stress, in the form of a bias voltage for a predetermined amount time, is needed for a particular one of the variable capacitors, the bias voltage can be applied to the variable capacitor in between communication transmission or reception bursts on an antenna, or in an alternating manner between two diversity antennas (a primary antenna and diversity antenna) so as to minimize communications while pre-stressing a variable capacitor.

Bias voltages are tracked so that additional stress is not added to a variable capacitor when it is not required. Adding stress to the dielectric of a variable capacitor when it is not required not only wastes battery power of the mobile communication device, but also can make the variable capacitor operate at too high a stress level such that the recovery dispersion is too large thereby limiting some advantages of pre-stressing the dielectric material.

Figure 6:
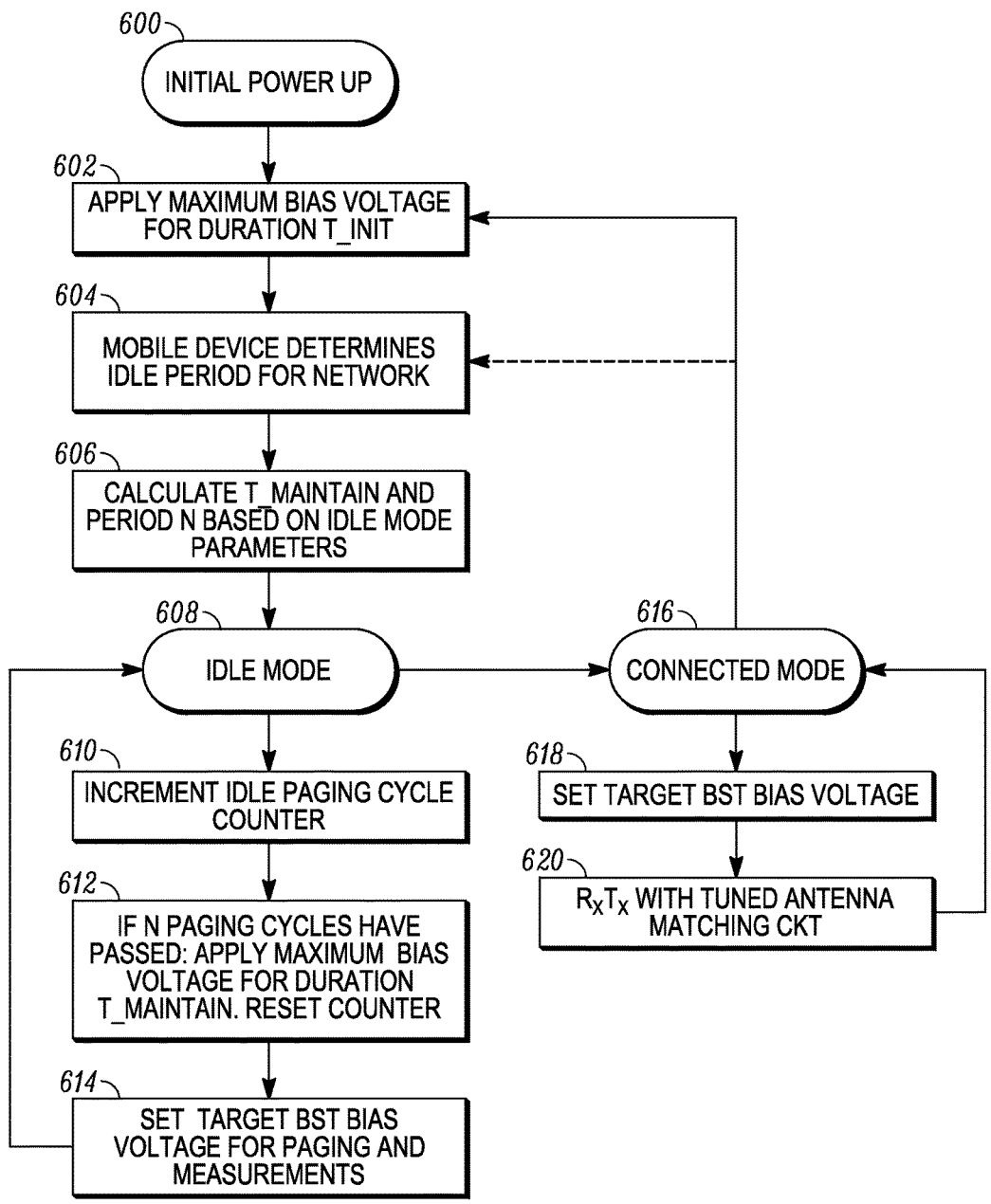
FIG. 6 illustrates is a flowchart of a method for maintaining stress on a variable capacitor dielectric in a mobile communication device.
Figure 7:
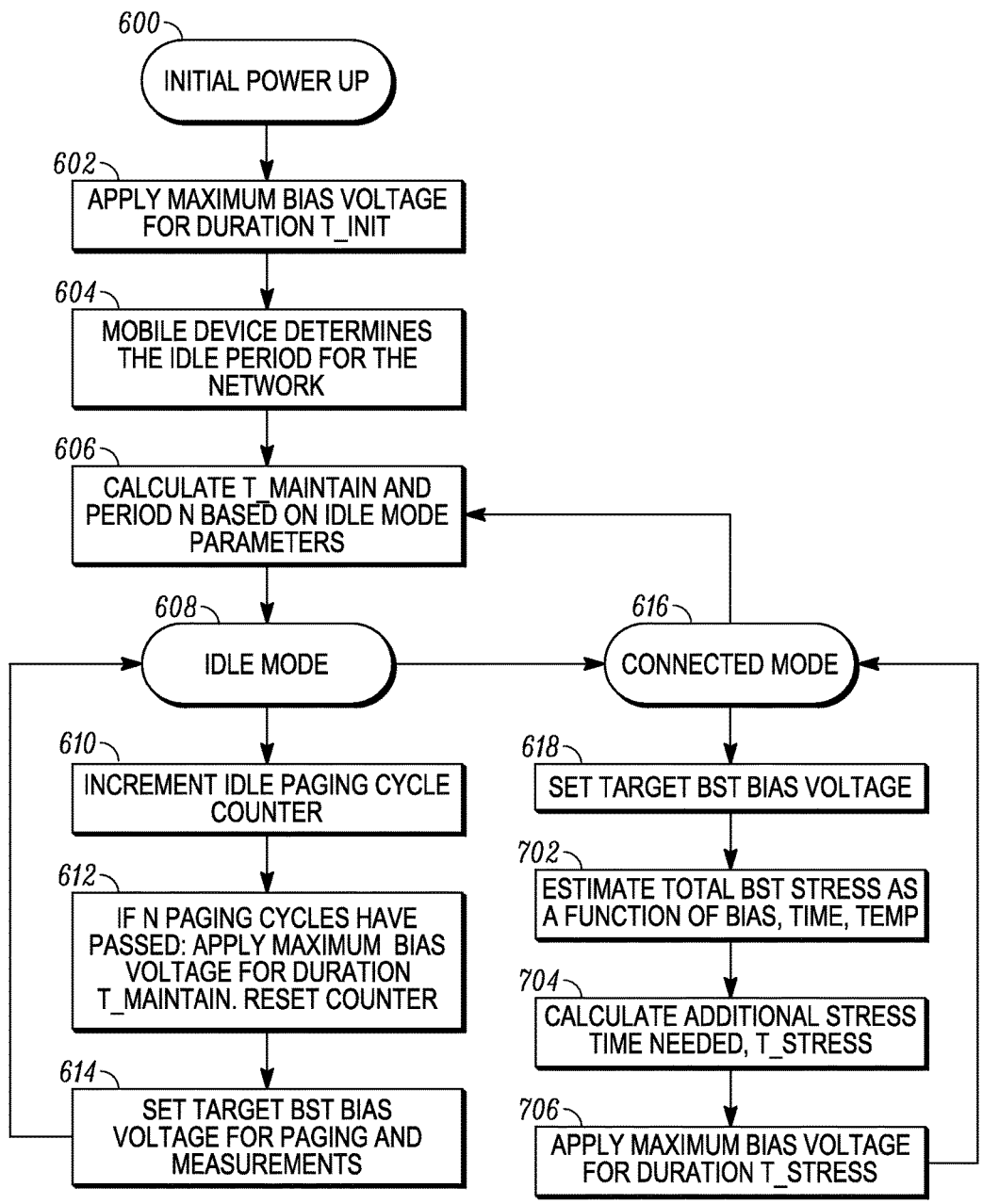
FIG. 7 illustrates a flowchart of another method for maintaining stress on a variable capacitor dielectric in a mobile communication device.

FIG. 6 provides a flowchart of a method for maintaining a variable capacitor in a pre-stress condition such that normal bias voltage variations applied to the variable capacitor within an antenna matching circuit result in small deviations (less than about +/−2 to +/−5%) from an expected or desired capacitance value of the variable capacitor for the applied bias voltage. In various embodiments, this method is replicated for each variable capacitor in the mobile communication device. Thus, here the method in FIGS. 6 and 7 are described for monitoring and tracking a single variable capacitor.

In FIG. 6, at step 600 a mobile communication device is powered up. It is understood that at the time of being powered up, the variable capacitors within the mobile communication device may be completely relaxed or unstressed state due to the mobile communication device having been off for a long period of time. Alternatively, the variable capacitors may already be stressed to some degree because the mobile communication device may have been in an off state for a short amount of time or may have merely been restarted or reset by the user. Regardless, at step 600 the mobile communication device is powered up to an on state and placed in a start-up mode.

At step 602, in some embodiments a maximum bias voltage is applied to the variable capacitor for a predetermined amount of time, t_init, after the initial power up in order to quickly bring the dielectric stress level of the variable capacitor to a target pre-stressed level. In one embodiment, the maximum bias voltage is about 20 V and the predetermined amount of time may be within a range of 0.1 to about 3 seconds. In other embodiments, at step 602, it may be determined that the variable capacitor is already at a pre-stressed level by the application processor running the mathematical capacitance stress model application that tracks an estimated pre-stressed level of the variable capacitors and/or from historic capacitance stress data stored in a memory of the mobile communication device by the mathematical capacitance stress model application prior to the mobile communication being shut down. If it is determined that the variable capacitor is already at a pre-stressed level, but below the target pre-stressed level, the mathematical capacitor stress model application will apply an appropriate amount of bias voltage (a midrange to a max voltage) to the variable capacitor for a calculated or predetermined amount time in order to bring the variable capacitor to at least the target pre-stressed level.

At step 604, the mobile communication device turns on the transceiver, adjusts or tunes the variable capacitors within the antenna matching circuit(s) to target values that closely impedance match the antenna to the transceiver during communication. Furthermore, the mobile communication device determines the idle period (duration time and frequency) that the mobile communication device must use when operating in idle mode with the present wireless communication network.

At step 606, based on the determined idle mode parameters for the present mobile communication network (e.g., GSM, CDMA, WCDMA, UMTS, LTE, PMR, WIMAX, WLAN or other 3G or 4G networks or Wi-Fi), the mathematical model capacitor stress application determines a maintenance time, t_maintain, and a period N for applying a predetermined bias voltage to the variable capacitor in order to maintain the pre-stressed level of the dielectric material in the variable capacitor. T_maintain is the amount of time a stressing voltage or bias voltage is applied every $N^{th}$ idle paging period, where N is an integer number of idle paging periods that occur between the bias voltage being applied to the variable capacitor. In other words, the bias voltage is applied every $N^{th}$ idle period for a t_maintain amount of time. In various embodiments, the stressing voltage may be a maximum voltage that can be applied to the variable capacitor. For example, the maximum voltage may be between 18 and 20 V.

At this time the mobile communication device enters an idle mode 608, which is a known state for the particular mobile communication device and mobile communication network. In idle mode the mobile communication device has an assigned slot for when the network periodically contacts or is to be contacted by the mobile communication device. At step 610, the idle paging cycle period counter is incremented to keep track of the number of paging cycles that have occurred. At step 612, if N paging cycles have passed, then the application processor running the mathematical model application applies a predetermined or maximum bias voltage to the variable capacitor for a duration time of t_maintain. Additionally if N paging cycles have passed, the idle paging cycle counter is reset. In some embodiments, the processor is configured to periodically originate a digital tuning signal that when received by a DAC produces a capacitor maintain bias voltage that is applied to the variable capacitor so that the variable capacitor is maintained at or above a target pre-stress condition.

At step 614, the mobile communication device is still in idle mode. While in idle mode, the transceiver is often required to periodically receive or send page information, power level information or other wireless communications with the present wireless network. To do so, the processor, via the DAC, sets the variable capacitor to an appropriate bias voltage for matching the antenna and transceiver circuit impedances for, for example, the periodic paging and or measurement communication frequencies. At this time, the mathematical capacitance stress model application loops back to the idle mode step 608 and continues looping through steps 608 through 614 as long as the mobile communication device is in idle mode.

At some point in time the mobile communication device exits out of idle mode and goes into connected mode 616. In connected mode, a call may be initiated by either the mobile communication device user or by another party who is calling the mobile communication device. Connected mode may also a be initiated by the sending or receiving of text messages or by the initialization or periodic updating of various applications adapted or configured to run on the application processor or other processor within the mobile communication device. In connected mode, the amount of dielectric stress on the variable capacitor may be constantly changing due to the tuning and retuning (i.e., the biasing of the variable capacitor at various voltages for various amounts of time) of the antenna matching circuit. Thus, in connected mode, the amount of stress at any time on a variable capacitor may be below, at, or may exceed the target amount of stress designated for the particular variable capacitor in the mathematical model capacitance stress application. Regardless, in some embodiments it is assumed that while the mobile communication device is in connected mode, the variable capacitor is biased at various voltages from time to time such that the variable capacitor remains in a stressed state that is near, at, or above the predetermined target pre-stress level.

At step 618, the processor, via the DAC, adjusts the variable capacitor to a target bias voltage resulting in a target capacitance for matching the antenna and transceiver circuit impedances in order to carry out the wireless communication function (e.g., phone conversation, texting, video conferencing, running an application that requires a wireless connection, etc.). In other words, the variable capacitor is set to receive a target bias voltage for its normal operation of matching the impedance of the antenna and transceiver at the frequency band on which the mobile communication device is communicating.

At step 620, the transceiver and antenna are tuned via the antenna matching circuit to carry out the wireless communication function. Then connected mode loops around while the wireless communication device remains in connected mode.

If at step 616 it is determined that the mobile communication device no longer needs to remain in connected mode and, for example, is to change back to idle mode, in some embodiments the mathematical capacitance stress model application will go back to step 602 and apply a maximum bias voltage for the duration t_int in order to set or place the variable capacitor's dielectric material at a stressed level that is greater or equal to the target pre-stressed level. Alternatively in other embodiments, when the mobile communication device is to exit connected mode at step 616, the method will go to step 604 and assume that the variable capacitor is already at some level of being pre-stressed. In this embodiment, the variable capacitor will be maintained at or above the target pre-stressed level while the mobile communication device is in idle mode and being biased by a maximum bias voltage every $N^{th}$ paging cycle.

In additional embodiments, step 602 is not performed after an initial power up or reset of the mobile communication device because the device goes into idle mode immediately for at least a number of paging cycles such that the variable capacitor's dielectric material will be stressed by the bias voltage applied every $N^{th}$ paging cycle in step 612. Additionally, it is understood in this embodiment that the mobile communication device will be able to receive and transmit in step 604, even though the antenna matching circuit may not be properly pre-stressed or impedance tuned, in order to determine the idle period for the network that the mobile device is operating in.

Referring now to FIG. 7, yet another embodiment of a method or mathematical capacitance stress model application running on the application processor of a mobile communication device is provided. Here in FIG. 7, steps 600 through 618 are substantially identical to the method described in FIG. 6. The difference in this embodiment is that during connected mode 616 the mathematical model capacitance stress application is continuously tracking the bias voltage being applied along with the amount of time that the bias voltage is being applied to the variable capacitor. Thus at step 702, the method estimates the total or running amount of stress on the variable capacitor's dielectric material as a function of the amount of bias applied and the amount of times the different amounts of bias were applied as well as the temperature inside the mobile communication device or near the variable capacitor. Using the continuously collected data (bias voltages, bias time, and temperature) at step 704, the method calculates whether additional stress time, t_stress, at a maximum bias voltage needs to be applied to the variable capacitor such that it is pre-stressed to level at or above the target pre-stressed level. At step 706, if is determined that no additional bias voltage needs be applied to the variable capacitor because the variable capacitor is already at or above the target pre-stressed level, then no bias voltage is applied. Conversely at step 706, if it is determined that an additional bias voltage needs to be applied to the variable capacitor in order to keep its dielectric stress level maintained at or above the target pre-stressed level, then the maximum bias voltage is applied for the calculated duration of time, t_stress. After performance of step 706 the method cycles back to step 616.

As has been discussed the RTZ effect or time variant dielectric hysteresis effect impacts the accuracy of antenna matching circuits that include variable BST capacitors. The impact can contribute as much as an 18% error to the variable capacitor capacitance at an unstressed state after being stressed at a high or near maximum allowable bias voltages for period of time. Embodiments described in this disclosure mitigate the impact of the RTZ effect by pre-stressing the variable capacitors and maintaining at least a target pre-stress level when the mobile communication device is operating so that the RTZ effect's uncertainty can be minimized. A result of using the methods discussed herein, the variable BST capacitor uncertainty is reduced, which leads to better impedance matched transceiver and antenna circuits, lower power consumption and transmission power loss.

It would be easily determined that a mobile communication device is incorporating an embodiment of the invention by monitoring the bias voltages applied to variable capacitors (or related signals) while the mobile communication device is operating in an idle state. If bias voltages are applied to variable capacitors, for example within an antenna matching circuit, when the transmission or reception is not occurring, then an embodiment of the invention may be incorporated into such a device.

Although the preferred embodiment has been described in detail, it should be understood that various changes, substitutions and alterations can be made therein without departing from the spirit and scope of the invention as defined by the appended claims.

What is claimed is:

1. An electronic device comprising:
   a variable capacitor comprising a dielectric material having a time variant hysteresis effect on a capacitance of the variable capacitor;
   a processor configured to periodically originate a capacitor maintain bias voltage; and
   wherein when the capacitor maintain bias voltage is periodically received by the variable capacitor, the dielectric material of the variable capacitor is maintained at or above a target pre-stress condition.

2. The electronic device of claim 1, wherein when the dielectric material of the variable capacitor is maintained at or above the target stress condition, the capacitance of the variable capacitor when at a zero bias state is maintained at a lower value than when the dielectric material of the variable capacitor is at an unstressed condition.

3. The electronic device of claim 1, wherein the processor is further configured to originate a target bias voltage, and wherein when the variable capacitor receives the target bias voltage after having received the capacitor maintain bias voltage, the capacitance of the variable capacitor is predictable to within less than about +/−5% of an expected capacitance value.

4. The electronic device of claim 3, further comprising:
   a transceiver; and
   an antenna, wherein the processor is further configured to originate the target bias voltage to the variable capacitor to match an impedance between the transceiver and the antenna.

5. The electronic device of claim 1, wherein the processor is further configured to periodically originate the capacitor maintain bias voltage when the electronic device is in an idle mode.

6. The electronic device of claim 5, wherein the processor is further configured to provide the capacitor maintain bias voltage when N paging cycles have passed according to an idle paging cycle period counter to the variable capacitor in order to maintain the target pre-stress condition of the dielectric material.

7. The electronic device of claim 5, wherein the processor is further configured to:
   when in connected mode, maintain the target pre-stress condition of the dielectric material, by providing an additional bias voltage if a stress of the dielectric material falls below the target pre-stress condition.

8. The electronic device of claim 7, further comprising a digital to analog circuit (DAC).

9. The electronic device of claim 1, wherein when the electronic device is in a start-up mode, the processor is further configured to originate an initial bias voltage that is received by the variable capacitor for a predetermined amount of time.

10. The electronic device of claim 1, wherein the processor is further configured to originate a tuning bias voltage that is received by the variable capacitor while the electronic device is transmitting or receiving a wireless communication, and wherein the processor does not originate the capacitor maintain bias voltage when the electronic device is transmitting or receiving the wireless communication.

11. The electronic device of claim 1, wherein the processor is further configured to keep track of a plurality of types of bias voltages that are received by the variable capacitor and the amount of time each bias voltage was applied to the variable capacitor, and wherein the capacitor maintain bias voltage is one of the plurality of bias voltages.

12. A mobile communication device comprising:
   a transceiver;
   an antenna;
   a digital to analog circuit (DAC);
   a processor configured to periodically provide a maintain capacitor stress signal to the DAC for a t_maintain duration of time;
   a variable capacitor comprising a dielectric material having a time variant hysteresis effect on a capacitance of the variable capacitor, the variable capacitor being connected between the transceiver and the antenna, and the variable capacitor being configured to receive a bias voltage from the DAC; and
   wherein during periodic receipt of the maintain capacitor stress signal at the DAC, the DAC provides a maintain bias signal for the t_maintain duration to the variable capacitor to maintain the dielectric material of the variable capacitor at at least a target stress level.

13. The mobile communication device of claim 12, wherein the processor is further configured to provide a capacitor tuning signal to the DAC; wherein during receipt of the capacitor tuning signal, the DAC provides a tuning bias signal to the variable capacitor; and wherein when the variable capacitor receives the tuning bias signal after having received the periodic maintain bias signal, the capacitance of the variable capacitor is within less than about +/−5% of an expected capacitance value.

14. The mobile communication device of claim 12, wherein the variable capacitor is further configured to operate as part of an impedance matching circuit connected between the transceiver and the antenna.

15. The mobile communication device of claim 14, wherein the processor is further configured to provide a capacitor tuning signal to the DAC; wherein upon receipt of the capacitor tuning signal, the DAC provides a tuning bias signal to the variable capacitor; and wherein when the variable capacitor receives the tuning bias signal after having received the initial bias signal, the capacitance of the variable capacitor is within less than about +/−5% of an expected capacitance value.

16. The mobile communication device of claim 12, wherein the processor is further configured during start-up of the mobile communication device to provide an initial bias signal to the DAC for a predetermined t_init amount of time; and wherein upon receipt of the initial bias signal, the DAC provides an initial bias voltage to the variable capacitor for the t_init amount of time to cause the dielectric material of the variable capacitor to be stressed to a at least the target stress level.

17. The mobile communication device of claim 12, wherein the processor is further configured to keep track of all the signals provided to the DAC to calculate an estimate of a stress level of the dielectric material of the variable capacitor and to determine whether the stress level is above or below the target stress level.

18. A method, carried out by an electronic device, of maintaining a dielectric material of a variable capacitor under stress in order to reduce capacitance variation due to a time variant hysteresis effect, the method comprising:
periodically applying a maintenance bias voltage to the variable capacitor for a predetermined amount of time to maintain at least a target stress level of the dielectric material of the variable capacitor, the target stress level being lower than a maximum stress level;
applying a tuning bias voltage to the variable capacitor while the dielectric material of the variable capacitor is at least at the target stress level; and
obtaining a capacitance value of the variable capacitor that is within +/−5% of an expected capacitance value.

19. The method of claim 18, wherein, prior to periodically applying the maintenance bias voltage to the variable capacitor, the method further comprises applying an initial bias voltage for a t_init amount of time to the variable capacitor to bring the dielectric material to at least a pre-stressed level.

20. The method of claim 19, wherein the pre-stressed level and the target stress level are substantially the same.

21. The method of claim 18, further comprising:
periodically applying the maintenance bias voltage to the variable capacitor for the predetermined amount of time to maintain at least the target stress level of the dielectric material of the variable capacitor, the target stress level being lower than the maximum stress level when the electronic device is in an idle mode; and
maintaining, when in connected mode, the target stress level of the dielectric material, by providing an additional bias voltage if a stress of the dielectric material falls below the target stress level.

22. In a mobile communication device comprising a transceiver, an antenna, a digital to analog converter (DAC), a processor and a variable capacitor connected in between the transceiver and the antenna, wherein the variable capacitor comprises a dielectric material having a time variant hysteresis effect on a capacitance of the variable capacitor, a method of maintaining the dielectric material of the variable capacitor at or above a target stress level to reduce the time variant hysteresis effect of the capacitance of the variable capacitor, the method comprising:
when the mobile communication device is operating in an idle mode:
applying, to the variable capacitor, a maintain bias voltage for a t_maintain amount of time periodically between a predetermined number N of paging cycles to maintain at least the target stress level.

23. The method of claim 22, wherein when the mobile communication device is in a start-up mode the method further comprises:
applying, to the variable capacitor, an initialize bias voltage for a t_init amount of time during the start-up mode to cause the dielectric material to be stressed to at least the target stress level.

24. The method of claim 22, wherein when the mobile communication device is in a connected mode the method further comprises:
applying, to the variable capacitor by the DAC in accordance with a tuning signal originating from the processor, a tuning bias voltage to the variable capacitor, and
setting the variable capacitor to within about +/−5% of a predetermined capacitance while the transceiver and antenna are being used to communicate on a wireless network.

25. The method of claim 24, further comprising:
estimating, by the processor, the stress level of the of the dielectric material of the variable capacitor as a function of a mathematical model of the variable capacitor, a history of bias voltages applied to the variable capacitor, and an amount of time that bias voltages were applied to the variable capacitor.

26. The method of claim 25, wherein the mathematical model of the variable capacitor further includes the temperature of the variable capacitor.

27. The method of claim 25, further comprising:
determining, by the processor, whether the estimated stress level is less than, equal to, or greater than the target stress level;
if the estimated stress level is greater than or equal to the target stress level, then no additional stressing bias voltage is applied to the variable capacitor; and
if the estimated stress level is below the target stress level, then applying, by the DAC in accordance with a stressing signal originating from the processor, a stressing bias voltage to the variable capacitor for a predetermined stressing time.

* * * * *